(12) United States Patent
Liu et al.

(10) Patent No.: US 10,453,870 B2
(45) Date of Patent: Oct. 22, 2019

(54) FLEXIBLE DISPLAY SUBSTRATE AND DISPLAY DEVICE

(71) Applicants: BOE Technology Group Co., Ltd., Beijing (CN); Chengdu BOE Optoelectronics Technology Co., Ltd., Chengdu (Sichuan Province) (CN)

(72) Inventors: Tingliang Liu, Beijing (CN); Zhonglin Cao, Beijing (CN); Pengcheng Zang, Beijing (CN); Yuanjie Xu, Beijing (CN); Yang Wang, Beijing (CN)

(73) Assignees: BOE Technology Group Co., Ltd., Beijing (CN); Chengdu BOE Optoelectronics Technology Co., Ltd., Chengdu (Sichuan Province) (CN)

( * ) Notice: Subject to any disclaimer, the term of this patent is extended or adjusted under 35 U.S.C. 154(b) by 0 days.

(21) Appl. No.: 15/810,815

(22) Filed: Nov. 13, 2017

(65) Prior Publication Data
US 2018/0308872 A1   Oct. 25, 2018

(30) Foreign Application Priority Data

Apr. 21, 2017   (CN) .......................... 2017 1 0265484

(51) Int. Cl.
*H01L 27/12* (2006.01)
*H01L 25/18* (2006.01)
(Continued)

(52) U.S. Cl.
CPC .......... *H01L 27/1244* (2013.01); *H01L 25/18* (2013.01); *H01L 27/1218* (2013.01); *G09F 9/301* (2013.01)

(58) Field of Classification Search
None
See application file for complete search history.

(56) References Cited

U.S. PATENT DOCUMENTS

2009/0256815 A1* 10/2009 Westerinen ............. G06F 3/044
                                                           345/174
2017/0013720 A1   1/2017 Okamoto et al.
2017/0212624 A1*  7/2017 Katsuta ................. G06F 3/0412

FOREIGN PATENT DOCUMENTS

| CN | 105224116 A | 1/2016 |
| CN | 105977264 A | 9/2016 |
| CN | 106057855 A | 10/2016 |

OTHER PUBLICATIONS

Machine-generated English translation of CN 105224116, total pp. 11.*

(Continued)

*Primary Examiner* — Duy T Nguyen
*Assistant Examiner* — Bo B Jang
(74) *Attorney, Agent, or Firm* — Arent Fox LLP; Michael Fainberg

(57) ABSTRACT

A flexible display substrate and a display device are disclosed. The flexible display substrate includes a plurality of signal lines located in a display area; a driver chip bound in a peripheral area; a plurality of lead wires configured to connect the driver chip with the signal lines, where both ends of each signal line correspond respectively to at least one lead wire. Both ends of a signal line can be arranged as such to correspond respectively to at least one lead wire, that is, the same signal line can correspond to at least two lead wires extended from an output end of the driver chip.

11 Claims, 7 Drawing Sheets

(51) Int. Cl.
*G06F 9/30* (2018.01)
*G09F 9/30* (2006.01)

(56) References Cited

OTHER PUBLICATIONS

Office Action dated Oct. 12, 2018 for Chinese Application 201710265484.6.

\* cited by examiner

FLEXIBLE DISPLAY SUBSTRATE AND DISPLAY DEVICE

CROSS-REFERENCES TO RELATED APPLICATIONS

This application claims priority to Chinese patent application No. 201710265484.6 filed on Apr. 21, 2017, which is incorporated herein by reference in its entirety.

FIELD

The present disclosure relates to the field of display technologies, and particularly to a flexible display substrate and a display device.

BACKGROUND

At present, the display technologies have been widely applied to TV sets, mobile phones, and displaying of public information. A flat panel display for displaying an image has been popularized due to its ultra-low thickness, energy saving, and other advantages. The flexible display is a prospective display technology, and the portable and popular display is expected to be newly favored in the market. One of challenges to the flexible display is that a metal wire when being bent tends to be broken, thus resulting in a failure. Scan signal lines and data signal lines control respective rows and columns of pixels in a display area to be turned on and off, so that when a scan line is broken, then a row of pixels may display abnormally, and when a data line is broken, then a column of pixels may display abnormally. Since the scan signal lines and the data signal lines are characterized by their large lengths and small radiuses, they tend to be broken due to a significant or concentrated stress in an irregularly shaped display screen, thus resulting in a display abnormality of the display product.

SUMMARY

An embodiment of the disclosure provides a flexible display substrate, which includes: a plurality of signal lines located in a display area; a driver chip bound in a peripheral area; a plurality of lead wires configured to connect the driver chip with the signal lines, wherein: both ends of each of the signal lines correspond respectively to at least one of the lead wires, the lead wire has one end connected with a corresponding pin of the driver chip, and the other end connected with one end of the corresponding signal line.

An embodiment of the disclosure provides a display device including the flexible display substrate above according to the embodiment of the disclosure.

DETAILED DESCRIPTION

Specific implementations of a flexible display substrate and a display device according to embodiments of the disclosure will be described below in details with reference to the drawings.

Figure 1:
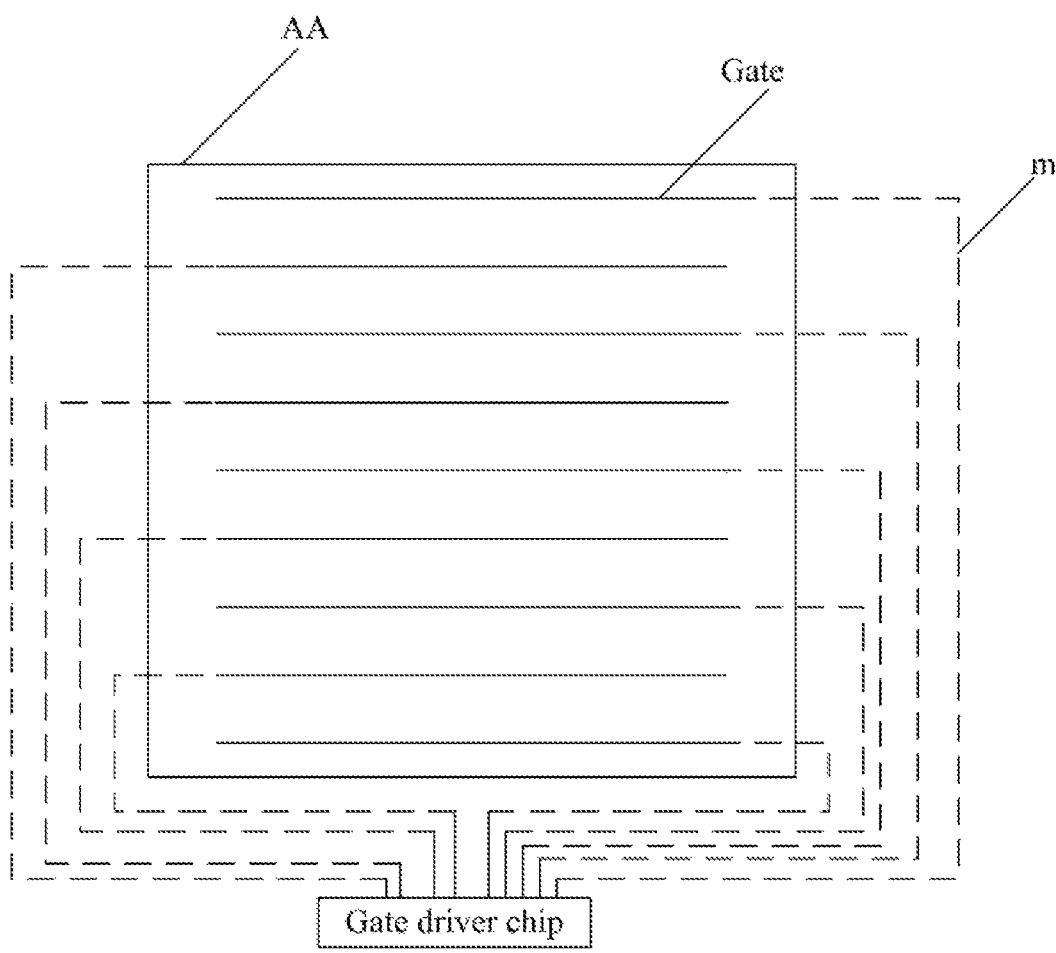
FIG. 1 is a schematic structural diagram of a display panel in the related art.

In some embodiments, as illustrated in FIG. 1, in the display panel, a plurality of lead wires m are extended from a gate driver chip, and connected with scan signal lines Gate in the display area AA. Each row of pixels (not illustrated) in the display area AA corresponds to one of gate lines; and also a plurality of lead wires are extended from a source driver chip, and connected respectively with a plurality of data lines, and each column of pixels (not illustrated) corresponds to one of the data lines. A scan signal line Gate controls a row of pixels to be turned on, and a data line transmits a data signal to a column of pixels, so that the display panel is scanned per row, and refreshed per frame to be driven to display normally.

Figure 2:
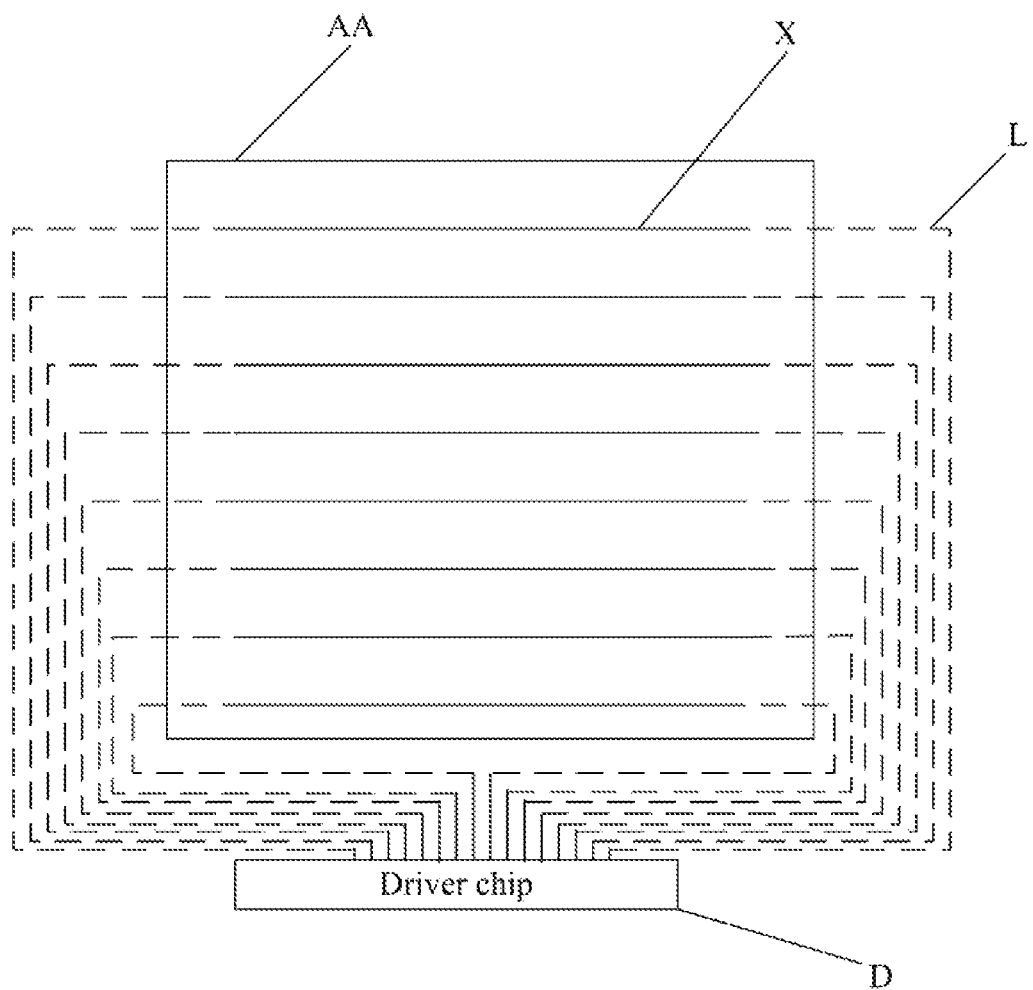
FIG. 2 to FIG. 7 are schematic structural diagrams of a flexible display substrate according to embodiments of the disclosure respectively.

An embodiment of the disclosure provides a flexible display substrate, as illustrated in FIG. 2, which can include: a plurality of signal lines X located in a display area AA, and a driver chip D bound in a peripheral area. The flexible display substrate can further include a plurality of lead wires L configured to connect the driver chip with the signal lines X, where both ends of each signal line X correspond respectively to at least one lead wire L, and one end of the lead wire L is connected with a corresponding pin of the driver chip D, and the other end of the lead wire L is connected with one end of the corresponding signal line X.

Figure 3:
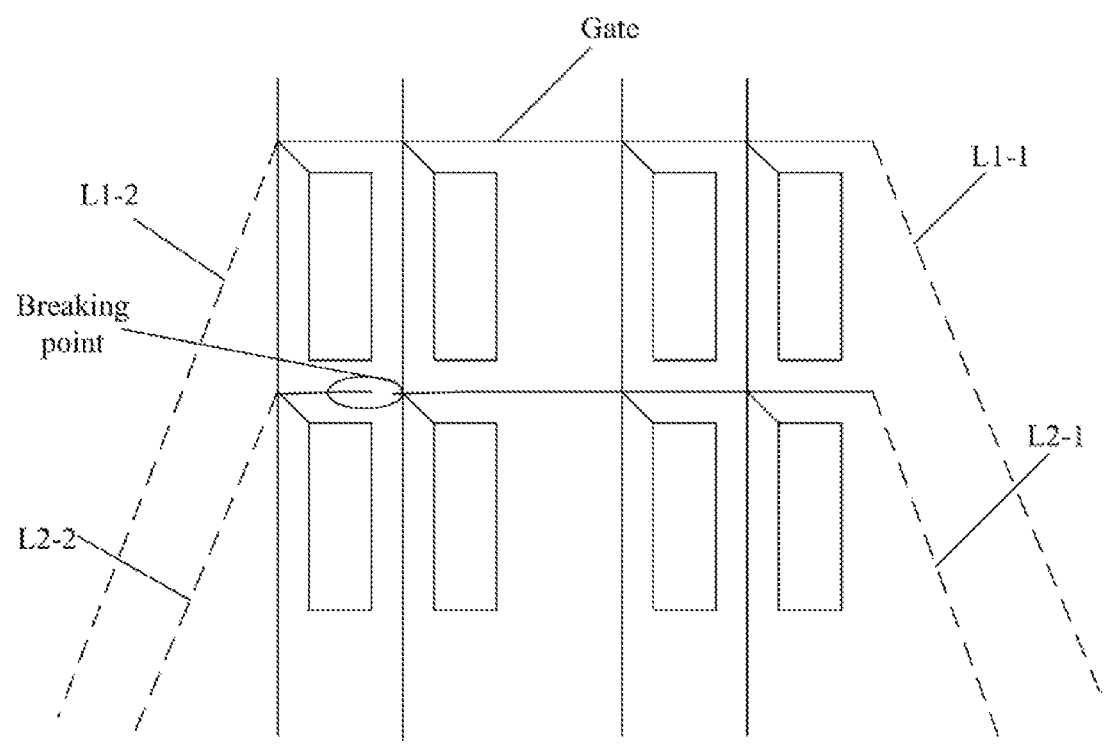

In the flexible display substrate according to the embodiment of the disclosure, the signal lines may be gate lines or data lines, or may be signal lines in the display panel to transmit a reset signal (Vinit), a reference signal (Vref), a power source signal (VDD), or a reset signal (Reset), etc. As illustrated in FIG. 3, the signal lines which are gate lines Gate may be described by way of an example. Both ends of a gate line Gate can be arranged to correspond respectively to at least one lead wire, that is, the same gate line Gate can correspond to at least two lead wires extended from an output end of the driver chip D, where at least two pins of the driver chip correspond to the same gate line. As illustrated in FIG. 3, the gate lines Gate can be arranged so that when a gate line Gate is broken due to an external stress (at the position denoted by the circle in FIG. 3), signals can be input through both ends of the gate line Gate, that is, the signals are input by the driver chip respectively through lead wires connected with both the ends of the gate line.

Specifically as illustrated in FIG. 3, the lead wires can be extended respectively from the left and the right output ends of the driver chip, and connected with both the ends of the gate line, that is, the two output pins of the driver chip correspond to one of the gate lines. In this way, even if a signal line is broken outside the display area, then a signal may be input through a signal line on the other end; and even if a signal line is broken at some point in the display area, then signals may be input respectively on both ends of the signal line to thereby perform a display function. For example, lead wires L1-1 and L1-2 are extended respectively from the left side and the right side of the driver chip, and lead wires L1-1 and L1-2 are connected with the first row of gate line, and lead wires L2-1 and L2-2 are extended respectively from the left side and the right side of the driver chip, and lead wires L2-1 and L2-2 are connected with the second row of gate line, where the lead wires L1-1 and L1-2, and L2-1 and L2-2 on the left and the right may be metal lines at the same layer, or may be metal lines arranged at different layers. When a flexible display screen displays normally, a signal or signals can be input on one or both of the sides; and when the flexible display screen is broken as illustrated in FIG. 3, a signal can be input through L2-1 to control the pixels on the left side of the breaking point to be turned on, and a signal can be input through L2-2 to control the pixels on the right side of the breaking point to be turned on, so that a normal display function of the display product can be performed. As compared with the related art in which a gate line corresponds to a lead wire, the problem of failing to input a signal normally when the gate line is broken can be alleviated to thereby improve the reliability of the display product. Of course, when the signal lines are data lines, also the problem of failing to input a signal normally when a data line is broken can be alleviated in effect.

Figure 4:
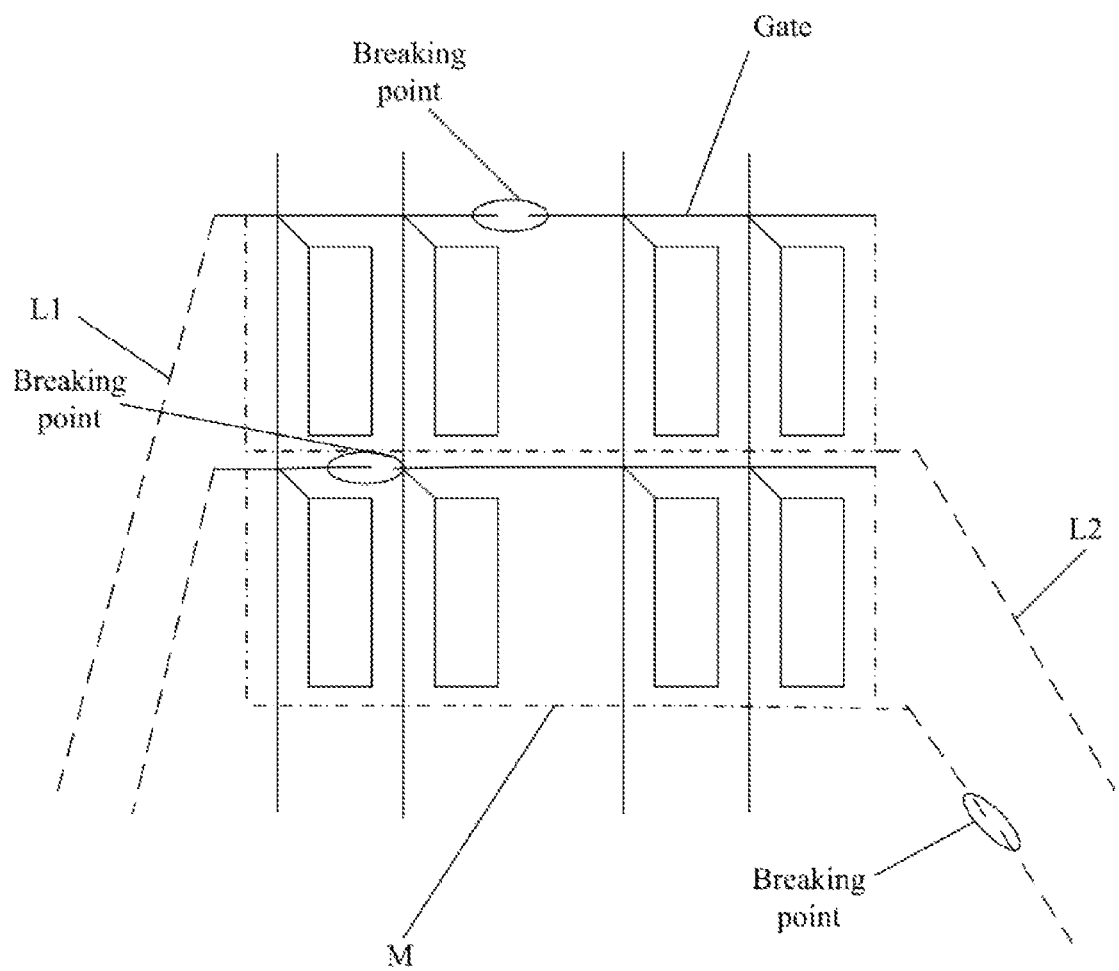

In some embodiments, in the flexible display substrate, as illustrated in FIG. 4, each signal line (which is illustrated in FIG. 4 as a gate line by way of an example) corresponds to two lead wires, which are a first lead wire L1 and a second lead wire L2 respectively. The flexible display substrate can further include a plurality of connecting wires M, where each signal line, i.e., the gate line Gate, corresponds to one of the connecting wires M, where the connecting wire M has one end connected respectively with one end of the gate line Gate and one end of the first lead wire L1, and the connecting wire M has the other end connected respectively with the other end of the gate line Gate, and one end of the second lead wire L2.

Specifically in the flexible display substrate above according to the embodiment of the disclosure, as illustrated in FIG. 4, each gate line Gate corresponds to two lead wires on the left and right, the two lead wires are connected through a connecting wire M. When the flexible display screen displays normally, a signal or signals can be input through the lead wire or lead wires on one or both of the sides; and when the first low of the gate line of the flexible display screen is broken as illustrated in FIG. 4, a signal can be input through the first lead wire L1 on the left to control the pixels on the left side of the breaking point to be turned on, and a signal can be input through the second lead wire L2 on the right to control the pixels on the right side of the breaking point to be turned on, so that a normal display function of the display product can be performed. When one of the lead wires, and the gate line corresponding thereto are broken, for example, the second low of gate line in FIG. 4 is broken, a signal can be transmitted through the connecting wire M from one end of the lead wire where no breaking occurs to the other side of the breaking point, to thereby enable the signal to be input throughout the gate line so as to improve the reliability of the display product.

In some embodiments, in the flexible display substrate, the first lead wires, the second lead wires, and the connecting wires can be arranged at the same layer so that the respective lead wires and connecting wires can be formed in the same patterning process to thereby save the fabrication process and lower the production cost. The respective lead wires and connecting wires can be arranged at the same layer as the gate lines and the data lines, or another metal layer than the gate lines and the data lines, although the embodiment of the disclosure will not be limited thereto.

Figure 5:
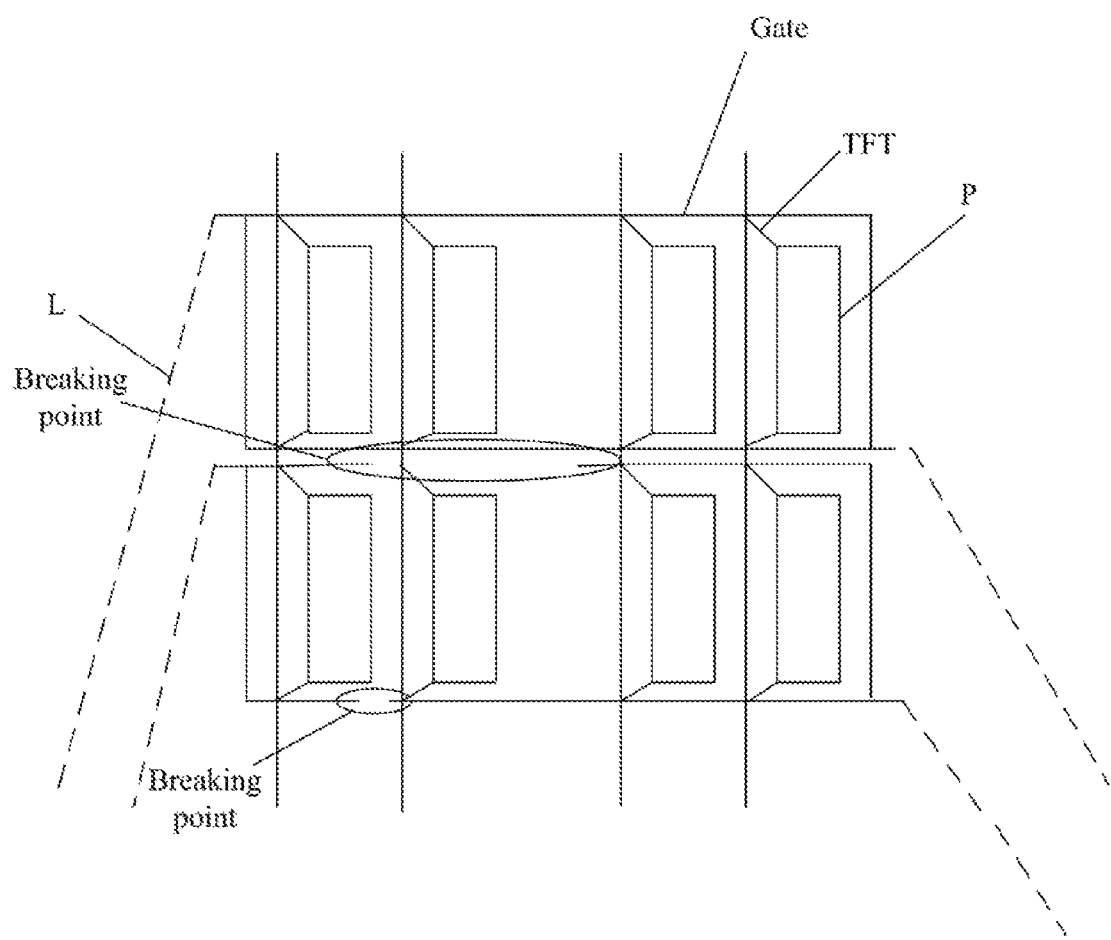

In some embodiments, as illustrated in FIG. 5, the flexible display substrate can further include a plurality of pixel elements P arranged in a matrix, where each row and/or column of pixel elements P corresponds to two signal lines (which are illustrated in FIG. 5 as gate lines by way of an example), and the ends of the two signal lines, i.e., gate lines Gate, on the same side are connected with the same lead wire L.

Specifically in the flexible display substrate above according to the embodiment of the disclosure, a row of pixel elements can be arranged to correspond to two gate lines as illustrated in FIG. 5, where the two gate lines Gate can be located respectively above and below the row of pixel elements P, and the ends of the two gate lines Gate on the same side are connected with the same lead wire L, so that a pixel element is controlled using two upper and lower TFTs, the two TFTs have the same ratio of the width to the length of a channel. Lead wires L are extended respectively from the left side and the right side of the driver chip, and connected with the ends of two upper and lower gate lines Gate corresponding to the same row of pixel elements P on the same side, where the lead wires L on the left and the right can be metal lines arranged at the same layer. When the flexible display screen displays normally, a signal or signals can be input on one or both of the sides to thereby perform a display function, where each pixel element P can be turned on using one or more TFT switches; and when there is a seriously broken line or point in the flexible display screen as illustrated in FIG. 5, for example, a signal can be input through the left lead wire L to turn on the pixels on the left side of the breaking point, and a signal can be input through the right lead wire L to turn on the pixels on the right side of the breaking point, so that a normal display function of the display product can be performed. In a specific implementation, when the signal lines are data lines, the problem of failing to input a signal normally due to a broken data line can be alleviated in effect using the same method above, and also two signal lines corresponding to each column of pixel elements can be located respectively on the left and the right of the corresponding column of pixel elements.

Figure 6:
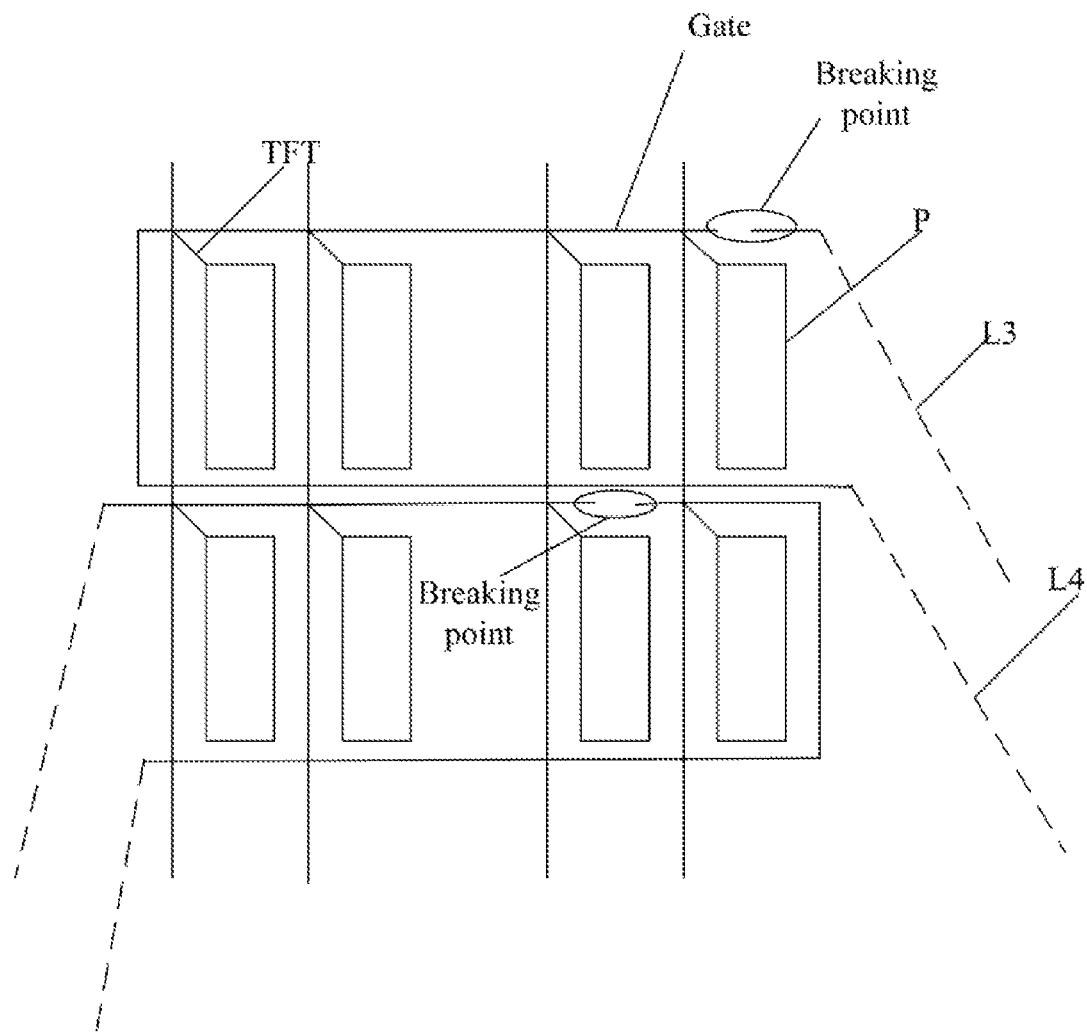

In some embodiments, as illustrated in FIG. 6, the flexible display substrate can further include a plurality of pixel elements P arranged in a matrix, where the signal lines are U-shaped signal lines, and each row and/or column of pixel elements P corresponds to one of the U-shaped signal lines; both ends of the U-shaped signal line correspond respectively to one lead wire, which are third lead wire L3 and fourth lead wire L4 respectively. One end of the U-shaped signal line is connected with the third lead wire L3, and the other end of the U-shaped signal line is connected with the fourth lead wire L4. The third lead wire L3 and the fourth lead wire L4 are located in a peripheral area on the same side to which both the ends of the U-shaped signal lines point.

Specifically in the flexible display substrate above according to the embodiment of the disclosure, as illustrated in FIG. 6, the signal lines are gate lines by way of an example, where the gate lines are designed in the U shape, both ends of a U-shape gate line correspond respectively to one lead wire, and the two lead wires can be arranged at the same or different layers, so that when one of the two lead wires is broken, a signal can be input through the other lead wire, and also when a gate line is broken, signals can be input respectively to both sides of the broken point of the gate line through the two lead wires, so that the problem of failing to input a signal normally when the gate line is broken can be alleviated in effect. As illustrated in FIG. 6, for example, the two ends of a U-shape gate line Gate are connected with one lead wire respectively, and the two lead wires can be arranged at the same or different layers. When the flexible display screen displays normally, signals can be input to the U-shape gate line through the two lead wires to thereby perform a normal function; when one of the lead wires in the flexible display screen being bent is broken as illustrated in FIG. 6, a signal can be input to the gate line through the other lead wire corresponding to the U-shape gate line to thereby perform a normal display function of the display product; and when there is a breaking point occurring at the middle of the gate line in the display area of the flexible display product, signals can be input respectively to both ends of the breaking point of the gate line through the two lead wires corresponding to the U-shape gate line to thereby perform a normal display function of the display product. In a specific implementation, when the signal lines are data lines, the same solution may apply thereto.

In some embodiments, the flexible display substrate can further include a plurality of common connecting wires, where each U-shape signal line corresponds to one of the common connecting wires; and each of the common connecting wires includes one end connected with a corresponding pin of the driver chip, and the other end connected respectively with the third lead wire and the fourth lead wire corresponding to the U-shaped signal line. Specifically two lead wires corresponding to the same U-shape signal line can be connected with corresponding output pins on the driver chip through the same common connecting wire to thereby save a peripheral wiring area of the display product so as to facilitate a design of the display product with a narrow edge frame.

Figure 7:
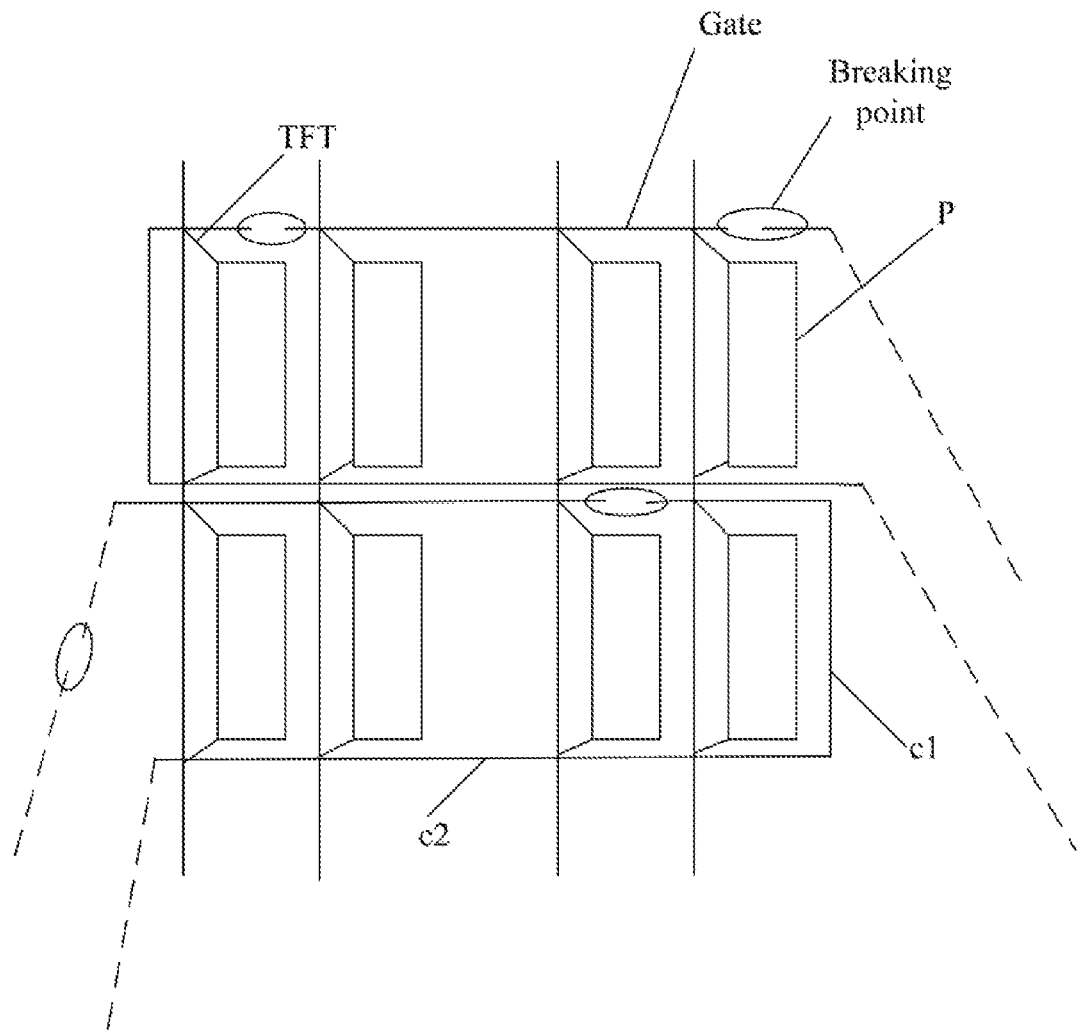

In some embodiments, in the flexible display substrate, as illustrated in FIG. 7, the signal lines are gate lines by way of an example, where the U-shaped gate line includes bottom component c1, and two parallel components c2 perpendicular to and connected with the bottom component c1. The bottom component c1 of the U-shaped gate line corresponding to each row of pixel elements P is perpendicular to the row direction of the pixel elements P, and the two parallel components c2 are located respectively above and below the corresponding row of pixel elements P. Specifically a row of pixel elements can be controlled using two upper and lower TFT switches with the same ratio of the width of a channel to the length thereof. The two parallel components c2 of the U-shaped gate line are connected respectively with one lead wire, and when the flexible display screen displays normally, signal scan be input through the two lead wires to control the corresponding TFTs to be turned on; and when there is a seriously broken line or point in the flexible display screen as illustrated in FIG. 7, for example, signals can be input to the left and the right of the breaking point of the gate line through the corresponding lead wires to enable the TFTs of the respective pixel elements to be turned on to thereby perform a normal display function. When the signal lines are data lines, the same solution may apply thereto, where the bottom component of the U-shaped signal line corresponding to each column of pixel elements is perpendicular to the column direction of the pixel elements, and the two parallel components thereof are located respectively on the left and the right of the corresponding column of pixel elements.

In a specific implementation, in the flexible display substrate above according to the embodiment of the disclosure, the lead wires can be arranged at the same layer as the gate lines or the data lines to thereby save the fabrication process and lower the production cost.

Based upon the same idea, an embodiment of the disclosure further provides a display device including the flexible display substrate according to any one of the embodiments above of the disclosure. The display device can be applicable to a mobile phone, a tablet computer, a TV set, a display, a notebook computer, a digital photo frame, a navigator, or any other product or component capable of displaying. Since the display device addresses the problem under a similar principle to that of the flexible display substrate, reference can be made to the implementations above of the flexible display substrate for an implementation of the display device, so a repeated description thereof will be omitted here.

In the flexible display substrate and the display device according to the embodiments of the disclosure, the flexible display substrate includes a plurality of signal lines located in a display area, and a driver chip bound in a peripheral area; and further includes a plurality of lead wires configured to connect the driver chip with the signal lines, where both ends of each signal line correspond respectively to at least one lead wire with one end connected with a corresponding pin of the driver chip, and the other end connected with one end of the corresponding signal line. Thus in the flexible display substrate according to the embodiment of the disclosure, both ends of a signal line can be arranged to correspond respectively to at least one lead wire, that is, the same signal line can correspond to at least two lead wires extended from an output end of the driver chip, that is, at least two pins of the driver chip correspond to the same signal line. In this arrangement pattern, when the signal line is broken due to an external stress, signals can be input through both the ends of the signal line, that is, the signals are input by the driver chip respectively through the lead wires connected with both the ends of the signal line. As compared with the related art in which a gate line corresponds to a lead wire, the problem of failing to input a signal normally when a signal line is broken can be alleviated to thereby improve the reliability of the display product.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A flexible display substrate, comprising:
a plurality of signal lines located in a display area;
a driver chip bound in a peripheral area;
a plurality of lead wires configured to connect the driver chip with the signal lines, wherein:
both ends of each of the signal lines correspond respectively to at least one of the lead wires, the lead wire has one end connected with a corresponding pin of the driver chip, and the other end connected with one end of a corresponding signal line;
wherein each of the signal lines corresponds to two of the lead wires, which are a first lead wire and a second lead wire respectively; and the flexible display substrate further comprises a plurality of connecting wires, wherein:
each of the signal lines corresponds to one of the connecting wires, the connecting wire has one end connected respectively with one end of the signal line and one end of the first lead wire, and the other end connected respectively with the other end of the signal line and one end of the second lead wire.

2. The flexible display substrate according to claim 1, wherein the first lead wire, the second lead wire, and the connecting wires are arranged at the same layer.

3. The flexible display substrate according to claim 1, further comprises a plurality of pixel elements arranged in a matrix;
each row and/or each column of the pixel elements corresponds to two of the signal lines; and
ends of the two signal lines on the same side are connected with the same one of the lead wires.

4. The flexible display substrate according to claim 3, wherein the two signal lines corresponding to each row of the pixel elements are located respectively above and below the corresponding row of the pixel elements; and the two signal lines corresponding to each column of the pixel elements are located respectively on the left and the right to the corresponding column of the pixel elements.

5. The flexible display substrate according to claim 1, further comprises a plurality of pixel elements arranged in a matrix;
the signal lines are U-shaped signal lines, and each row and/or each column of the pixel elements corresponds to one of the U-shaped signal lines; and both ends of each of the U-shaped signal lines correspond respectively to third lead wire and fourth lead wire; and
one end of each of the U-shaped signal lines is connected with the third lead wire, and the other end of each of the U-shaped signal lines is connected with the fourth lead wire; and the third lead wire and the fourth lead wire are located in a peripheral area on the same side to which both ends of each of the U-shaped signal lines.

6. The flexible display substrate according to claim 5, wherein the third lead wire and the fourth lead wire are arranged at different layers.

7. The flexible display substrate according to claim 5, further comprises a plurality of common connecting wires;
each of the U-shape signal lines corresponds to one of the common connecting wires; and
one end of the common connecting wire is connected with a corresponding pin of the driver chip, and the other end of the common connecting wire is connected respectively with the third lead wire and the fourth lead wire corresponding to the U-shaped signal line.

8. The flexible display substrate according to claim 5, wherein each of the U-shaped signal lines comprises a bottom component, and two parallel components perpendicular to and connected with the bottom component;
the bottom component of the U-shaped signal line corresponding to each row of the pixel elements is perpendicular to the row direction of the pixel elements, and the two parallel components are located respectively above and below the corresponding row of the pixel elements; and
the bottom component of the U-shaped signal line corresponding to each column of the pixel elements is perpendicular to the column direction of the pixel elements, and the two parallel components are located respectively on the left and the right to the corresponding column of the pixel elements.

9. The flexible display substrate according to claim 1, wherein the signal lines are gate lines or data lines.

10. The flexible display substrate according to claim 9, wherein the lead wires are arranged at the same layer as the gate lines or the data lines.

11. A display device, comprising a flexible display substrate, wherein the flexible display substrate comprises:
a plurality of signal lines located in a display area;
a driver chip bound in a peripheral area;
a plurality of lead wires configured to connect the driver chip with the signal lines, wherein:
both ends of each of the signal lines correspond respectively to at least one of the lead wires, the lead wire has one end connected with a corresponding pin of the driver chip, and the other end connected with one end of a corresponding signal line;
wherein each of the signal lines corresponds to two of the lead wires, which are a first lead wire and a second lead wire respectively; and the flexible display substrate further comprises a plurality of connecting wires, wherein:
each of the signal lines corresponds to one of the connecting wires, the connecting wire has one end connected respectively with one end of the signal line and one end of the first lead wire, and the other end connected respectively with the other end of the signal line and one end of the second lead wire.

* * * * *